United States Patent
Lin et al.

(10) Patent No.: US 9,502,360 B2
(45) Date of Patent: Nov. 22, 2016

(54) STRESS COMPENSATION LAYER FOR 3D PACKAGING

(75) Inventors: Chun-Hung Lin, Taipei (TW); Yu-Feng Chen, Hsin-Chu (TW); Han-Ping Pu, Taichung (TW); Hung-Jui Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 366 days.

(21) Appl. No.: 13/348,449

(22) Filed: Jan. 11, 2012

(65) Prior Publication Data
US 2013/0175705 A1 Jul. 11, 2013

(51) Int. Cl.
| | |
|---|---|
| H01L 23/52 | (2006.01) |
| H01L 23/00 | (2006.01) |
| H01L 25/10 | (2006.01) |
| H01L 23/31 | (2006.01) |
| H01L 21/56 | (2006.01) |
| H01L 23/498 | (2006.01) |

(52) U.S. Cl.
CPC .......... *H01L 23/562* (2013.01); *H01L 21/565* (2013.01); *H01L 23/3121* (2013.01); *H01L 23/3128* (2013.01); *H01L 23/49822* (2013.01); *H01L 25/105* (2013.01); *H01L 2224/16225* (2013.01); *H01L 2225/1023* (2013.01); *H01L 2225/1058* (2013.01); *H01L 2924/01322* (2013.01); *H01L 2924/15311* (2013.01); *H01L 2924/15321* (2013.01); *H01L 2924/18161* (2013.01); *H01L 2924/3511* (2013.01)

(58) Field of Classification Search
CPC ............ H01L 23/562; H01L 23/49822; H01L 23/3121; H01L 23/3128; H01L 25/105; H01L 2924/01322; H01L 2225/1023; H01L 2225/1058; H01L 2924/3511; H01L 2924/18161; H01L 2224/16225; H01L 2924/15321; H01L 2924/15311

USPC ................ 257/685, 686, 723, 724, E23.039, 257/E23.043, E23.123–E23.125, E23.135
See application file for complete search history.

(56) References Cited

U.S. PATENT DOCUMENTS

| | | | | |
|---|---|---|---|---|
| 5,801,437 A | * | 9/1998 | Burns | ............... H01L 23/16 257/685 |
| 2004/0012992 A1 | * | 1/2004 | Koh | .................. G11C 5/04 365/63 |
| 2004/0092052 A1 | * | 5/2004 | Chang | .................. G02B 6/132 438/27 |

(Continued)

FOREIGN PATENT DOCUMENTS

| | | |
|---|---|---|
| CN | 101320696 | 12/2008 |
| JP | 2006278906 | 10/2006 |

(Continued)

*Primary Examiner* — Ermias Woldegeorgis
(74) *Attorney, Agent, or Firm* — Slater Matsil, LLP

(57) ABSTRACT

A stress compensation for use in packaging, and a method of forming, is provided. The stress compensation layer is placed on an opposing side of a substrate from an integrated circuit die. The stress compensation layer is designed to counteract at least some of the stress exerted structures on the die side of the substrate, such as stresses exerted by a molding compound that at least partially encapsulates the first integrated circuit die. A package may also be electrically coupled to the substrate.

20 Claims, 5 Drawing Sheets

(56) References Cited

U.S. PATENT DOCUMENTS

| | | | |
|---|---|---|---|
| 2004/0124452 A1* | 7/2004 | Wellhausen | H01L 23/562 257/295 |
| 2005/0133916 A1* | 6/2005 | Karnezos | H01L 23/4334 257/738 |
| 2005/0221534 A1 | 10/2005 | Suh et al. | |
| 2006/0001166 A1* | 1/2006 | Igarashi | H01L 23/3128 257/758 |
| 2006/0105497 A1* | 5/2006 | Suh | H01L 21/4853 438/108 |
| 2006/0220261 A1 | 10/2006 | Egawa | |
| 2007/0075435 A1* | 4/2007 | Suminoe | H01L 21/563 257/777 |

FOREIGN PATENT DOCUMENTS

| | | |
|---|---|---|
| TW | 200849516 | 12/2008 |
| TW | 201130102 | 9/2011 |

\* cited by examiner

STRESS COMPENSATION LAYER FOR 3D PACKAGING

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

Another 3D package utilized packaging-on-packaging (PoP) or interposer techniques for stacking dies to reduce form factor. PoP includes a first die electrically coupled to a silicon interposer, with another packaged die placed over the first die and electrically coupled to the silicon interposer. The silicon interposer is then electrically coupled to another substrate, such as a printed circuit board.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Figure 1:
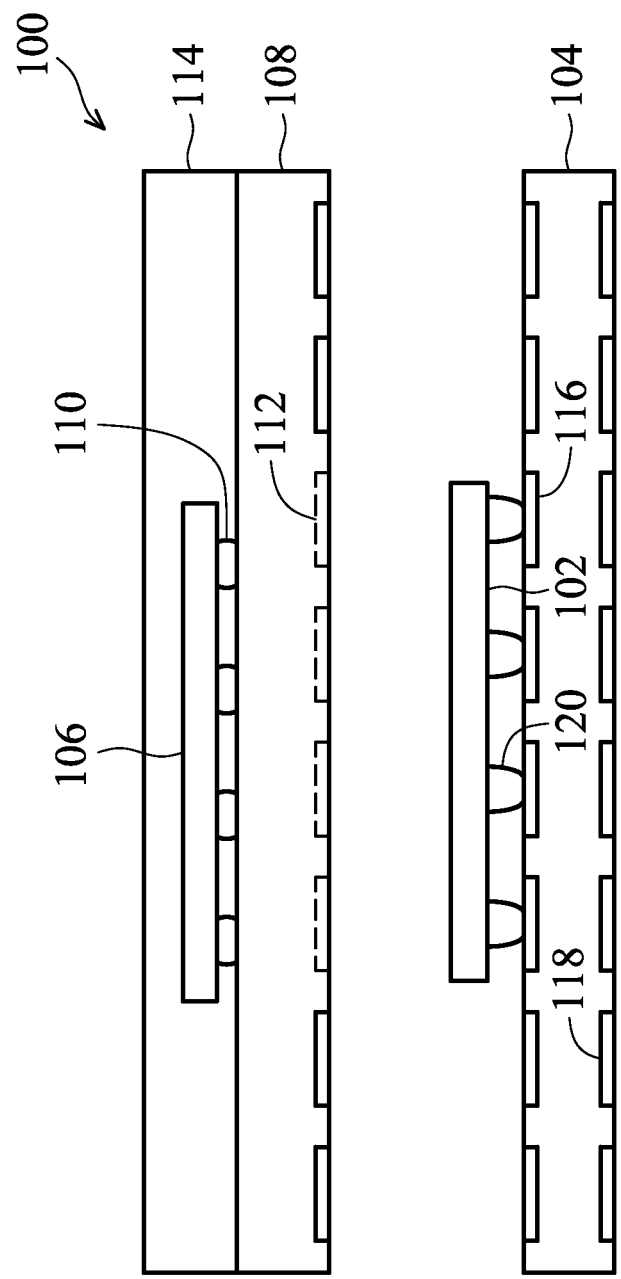
FIGS. 1-5 illustrate various intermediate stages of forming an embodiment.

Referring first to FIG. 1, there is shown a cross-section view of a first substrate 108 and a second substrate 104 in accordance with an embodiment. In an embodiment, the first substrate 108 is a component of a package 100, which may include, for example, a first integrated circuit die 106 mounted on the first substrate 108 via a first set of conductive connections 110. The first set of conductive connections 110 may comprise, for example, lead free solder, eutectic lead, conductive pillars, combinations thereof, and/or the like.

The first substrate 108 may be, for example, a packaging substrate, a printed-circuit board, a high-density interconnect, or the like. Through vias (TVs) (not shown) may be used to provide electrical connections between the first integrated circuit die 106 and a first set of conductive features 112 on an opposing surface of the first substrate 108. The first substrate 108 may also include redistribution lines (RDLs) (not shown) within and/or on one or both surfaces of the first substrate 108 to allow for a different pin configuration as well as a larger electrical connections. An encapsulant or overmold 114 may also be formed over the components to protect the components from the environment and external contaminants.

The second substrate 104 may further have a second integrated circuit die 102 mounted thereon, in accordance with an embodiment. As will be discussed in greater detail below, the package 100 will be electrically coupled to the second substrate 104, thereby creating a Package-on-Package (PoP).

The second substrate 104 further includes a second set of conductive features 116 on a same surface of the second substrate 104 upon which the second integrated circuit die 102 is mounted and a third set of conductive features 118 along an opposing surface of the second substrate 104 from the second integrated circuit die 102. In this embodiment, the second substrate 104 provides an electrical connection between the first integrated circuit die 106 and the second integrated circuit die 102, and/or between the third set of conductive features 118 of the second substrate 104 and one or both of the first integrated circuit die 106 and the second integrated circuit die 102 via a subsequently formed set of conductive connections (see FIG. 5). TVs (not shown) in the second substrate 104 provide an electrical connection between the second set of conductive features 116 and the third set of conductive features 118. The second substrate 104 may also include RDLs (not shown) within and/or on one or both surfaces of the second substrate 104 to allow for a different pin configuration as well as larger electrical connections. In an embodiment, the second substrate 104 may be any suitable substrate, such as a silicon substrate, an organic substrate, a ceramic substrate, a dielectric substrate, a laminate substrate, or the like.

As illustrated in FIG. 1, the second integrated circuit die 102 is electrically coupled to some of the conductive features of the second set of conductive features 116 on the second substrate 104 via a second set of conductive connections 120. The second set of conductive connections 120 may comprise, for example, lead free solder, eutectic lead, conductive pillars, combinations thereof, and/or the like.

The second integrated circuit die 102 and the first integrated circuit die 106 may be any suitable integrated circuit die for a particular application. For example, one of the second integrated circuit die 102 and the first integrated circuit die 106 may be a memory chip, such as a DRAM, SRAM, NVRAM, and/or the like, while the other die may be a logic circuit.

Figure 2:
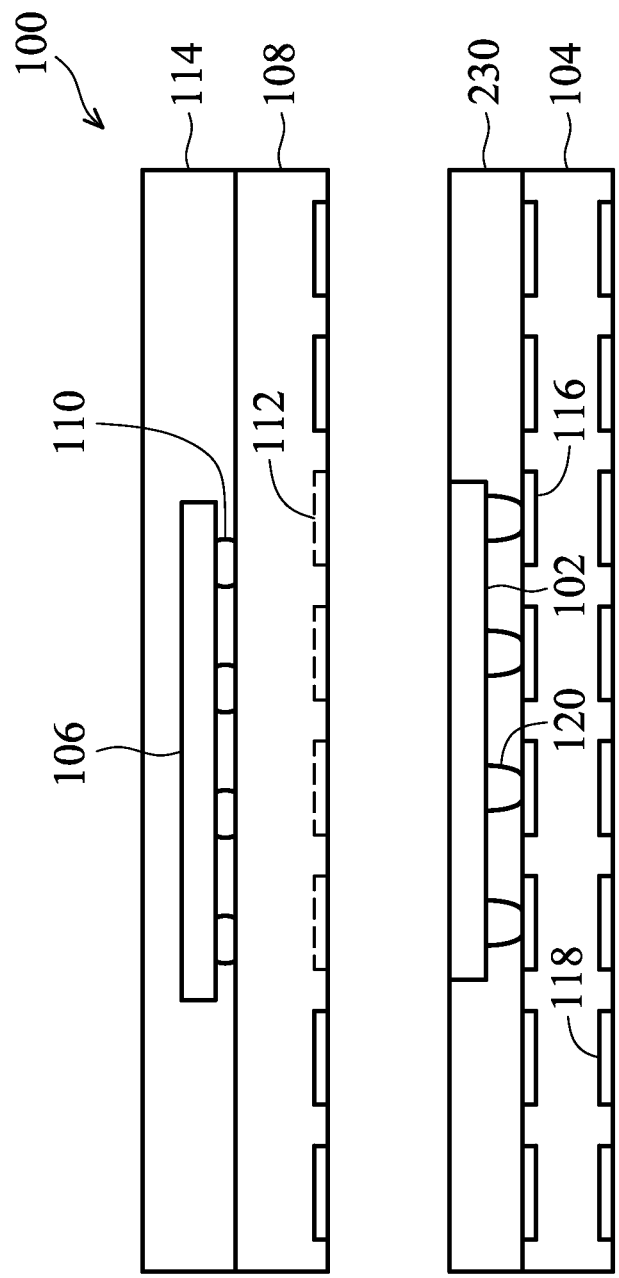

Referring now to FIG. 2, there is shown a molding compound 230 applied on the second substrate 104. In an embodiment, the molding compound 230 is a molding underfill (MUF) comprising, for example, a polymer, epoxy, and/or the like. The molding compound 230 may be in contact with the top surface and the edges of the second integrated circuit die 102. The molding compound 230 may be molded onto the second integrated circuit die 102 and the second substrate 104 using, for example, compressive molding or transfer molding. The embodiment illustrated in FIG.

2 has a top surface of the molding compound 230 coplanar with a top surface of the second integrated circuit die 102. In other embodiments, a top surface of the molding compound 230 may be higher than a top surface of the second integrated circuit die 102 such that the second integrated circuit die 102 may be fully encapsulated in the molding compound 230. Optionally, a grinding or polishing process may be performed to remove portions of the molding compound 230 from over a top surface of the second integrated circuit die 102 to expose the second integrated circuit die 102.

Figure 3:
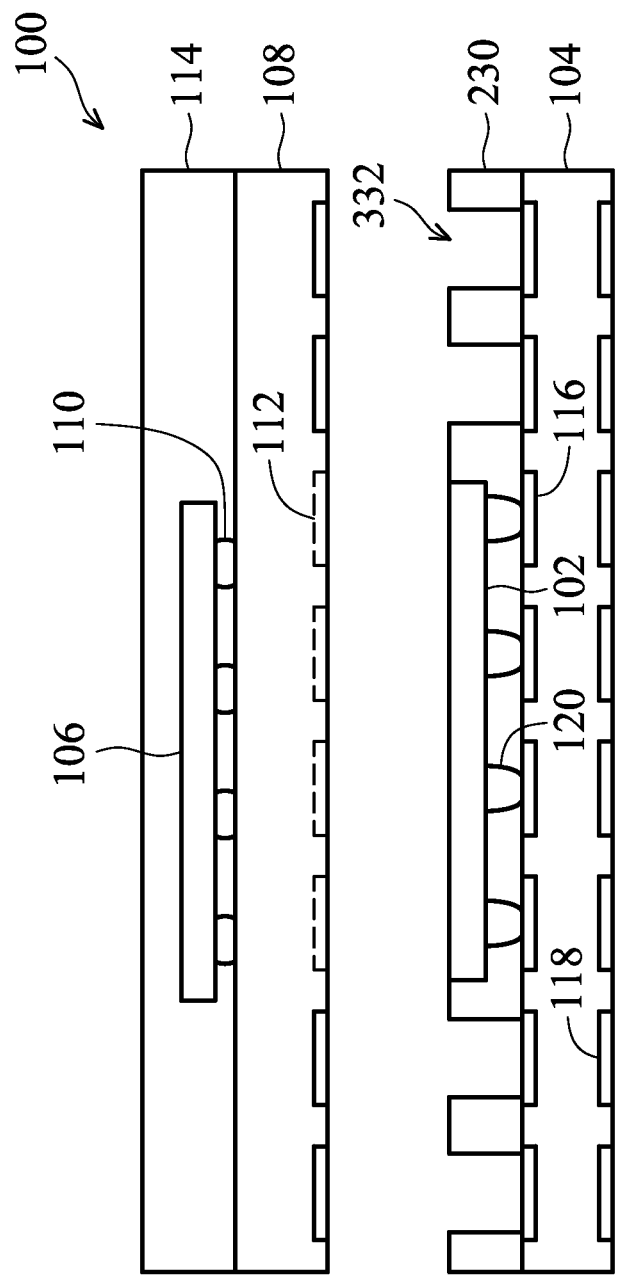

FIG. 3 illustrates formation of openings 332 in molding compound 230. Openings 332 may be formed through drilling, etching, or the like, and may expose at least a portion of respective ones of the second set of conductive features 116 positioned on the second substrate 104. As will be discussed in greater detail below, the openings 332 will be utilized to provide an electrical connection between corresponding ones of the first set of conductive features provided on the first substrate 108 and the second set of conductive features 116 provided on the second substrate 104.

Figure 4:
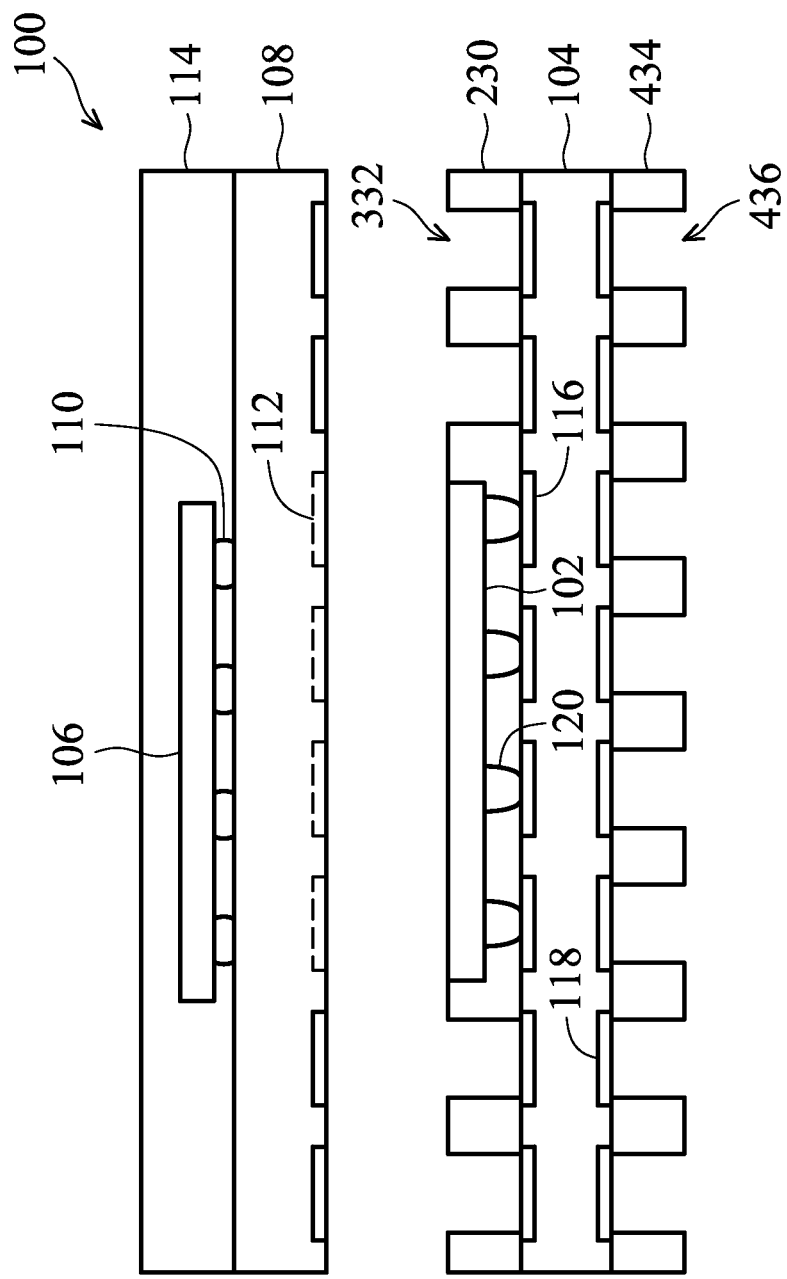

FIG. 4 illustrates formation of a stress compensation layer 434 on an opposing surface of the second substrate 104 from the molding compound 230 in accordance with an embodiment. It has been found that as the temperature of the second substrate 104 and the molding compound 230 varies, the respective layers may expand and/or contract at different rates due to the differences in the coefficient of thermal expansions (CTEs) of the differing materials used to form the respective structures. For example, in an embodiment in which the second substrate 104 comprises a silicon interposer, the molding compound 230 may shrink at a faster rate than the silicon interposer when subjected to a decreasing temperature from 170° C. to 25° C. (about room temperature). Due to this difference in the CTEs and, hence, the shrinkage rate, the molding compound 230 may exert stress on, e.g., the second substrate 104, in some situations causing the second substrate 104 to warp. This warping may in turn cause stress in the electrical connections (e.g., solder balls) between the second substrate 104 and other substrates, such as the first substrate 108 and/or another substrate coupled to the second substrates 104. In these cases, it is believed that forming a stress compensation layer 434 along a surface of the second substrate 104 opposite from the molding compound 230 may counter the stresses exerted by the molding compound 230, thereby reducing the warpage and the stress on the electrical connections.

In an embodiment in which the second substrate 104 comprises a silicon interposer, the stress compensation layer 434 may comprise a liquid molding compound (such as Sumitomo G350S), a polyimide (such as HD-8820 Polybenzoxazole (PBO) provided by HD Microsystems and WPR-5105 provided by JSR Corporation), and/or the like. The thickness of the stress compensation layer 434 may be adjusted to exert the appropriate amount of counteracting stress. In an embodiment, the thickness of the stress compensation layer 434 is determined by the following equation:

$$THK_{LMC} \cong \frac{CTE_{Molding} \cdot E_{Molding} \cdot THK_{Molding}}{CTE_{LMC} \cdot E_{LMC}};$$

wherein:

$CTE_{Molding}$ is the coefficient of thermal expansion of the material of the molding compound 230;

$E_{Molding}$ is the Young's Modulus of the material of the molding compound 230;

$THK_{Molding}$ is the thickness of the molding compound 230;

$CTE_{Compensation}$ is the coefficient of thermal expansion of the material of the stress compensation layer 434;

$E_{Compensation}$ is the Young's Modulus of the material of the stress compensation layer 434; and $THK_{Compensation}$ is the desired thickness of the stress compensation layer 434.

A second set of openings 436 may be formed in the stress compensation layer 434, thereby exposing corresponding ones of the third set of conductive features 118. The second set of openings 436 may be formed through drilling, etching, or the like. As will be discussed in greater detail below, the second set of openings 436 will be utilized to provide an electrical connection between corresponding ones of the second set of conductive features 116 provided on the second substrate 104 and conductive features of a third substrate (see, e.g., FIG. 5).

Figure 5:
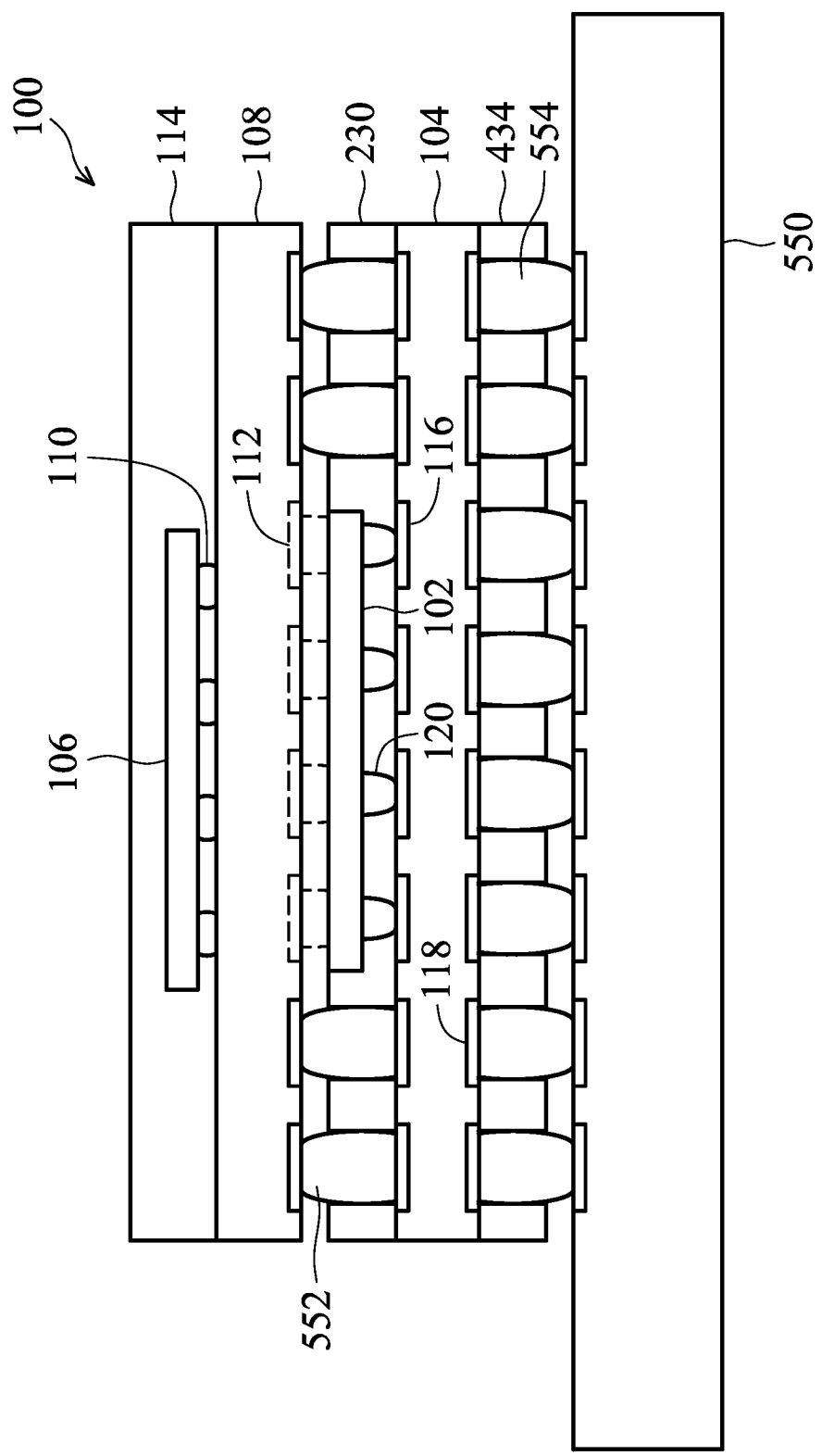

FIG. 5 illustrates an embodiment after coupling the package 100 to the second substrate 104, and coupling the second substrate 104 to a third substrate 550 in accordance with an embodiment. In an embodiment, the package 100 may be coupled to the second substrate 104, and the second substrate 104 may be coupled to a third substrate 550 using conductive elements 552 and 554, respectively. The conductive elements 552 and 554 may be formed of a eutectic solder, lead free solder, or the like. In other embodiments, the conductive elements 552 and 554 may comprise conductive pillars, with or without the solder or solder-type material. The first substrate 108, the second substrate 104, and/or the third substrate 550 may include an under-bump metallization (UBM) to provide suitable contact regions for the conductive features. In an embodiment, the first set of conductive features 112 on the first substrate 108 and the second and third set of conductive features 116 and 118 on the second substrate 104 may be arranged in a ball grid array (BGA) arrangement.

The third substrate 550 may comprise any suitable substrate upon which the second substrate 104 may be attached. For example, the third substrate 550 may comprise a printed circuit board (PCB), a high-density interconnect, a silicon substrate, an organic substrate, a ceramic substrate, a dielectric substrate, a laminate substrate, or the like.

The embodiment illustrated in FIG. 5 has gaps between the first substrate 108 and the molding compound and between the stress compensation layer 434 and the third substrate 550. In other embodiments, these gaps may be filled with an underfill to provide additional protection against the environmental factors.

It should be understood that the above description provides a general description of embodiments and that embodiments may include numerous other features. For example, embodiments may include under bump metallization layers, passivation layers, molding compounds, additional dies and/or substrates, and the like. Additionally, the structure, placement, and positioning of the first integrated circuit die 106 and the second integrated circuit die 102 are provided for illustrative purposes only, and accordingly, other embodiments may utilize different structures, placements, and positions.

It should also be understood that the ordering of the various steps discussed above are provided for illustrative purposes only, and as such, other embodiments may utilize different sequences. For example, formation of the stress compensation layer 434 may occur before or after coupling the second integrated circuit die 102 to the second substrate 104, before or after coupling the first substrate 108 to the second substrate 104, and/or the like. These various orderings of the step are to be included within the scope of embodiments.

In an embodiment, a semiconductor device is provided. The semincoductor device includes a first substrate having a first side and a second side, a first die mounted on the first side of the first substrate, a molding compound formed over at least a portion of the first side of the first substrate, a stress compensation layer formed over the second side of the first substrate, and a second substrate electrically coupled to the first substrate on the first side.

In another embodiment, a semiconductor device is provided. The semiconductor device includes a first package comprising a first integrated circuit die and a first substrate comprising a first set of conductive features on a first side and a second set of conductive features on a second side. The first package is electrically coupled to a first subset of the first set of conductive features on the first side of the first substrate. The semiconductor device further comprises a second integrated circuit die electrically coupled to a second subset of the first set of conductive features on the first side of the first substrate, a molding compound at least partially encapsulating the second integrated circuit die, and a stress compensation layer along the second side of the first substrate. The stress compensation layer comprises openings formed therein to at least partially expose corresponding ones of the second set of conductive features on the second side of the first substrate, the stress compensation layer exerting a force in an opposing direction as a stress exerted by the molding compound.

In yet another embodiment, a method is provided. The method comprises providing a first substrate having a first side and an opposing second side, attaching a first die to the first side of the first substrate, forming a molding compound on the first side of the first substrate, and forming a stress compensation layer on the second side of the first substrate.

Although the present disclosure and its advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
a first substrate having a first side and a second side;
a first die mounted on the first side of the first substrate;
a molding compound formed on, and limited to, the first side of the first substrate;
a stress compensation layer formed on, and limited to, the second side of the first substrate, wherein the stress compensation layer is configured to counter a stress applied to the first substrate by the molding compound, with a first stress exerted to the first substrate by the stress compensation layer being substantially equal to a second stress exerted to the first substrate by the molding compound, wherein the stress compensation layer has a through-opening extending to the first substrate, and wherein a thickness of the stress compensation layer is about:

$$\frac{CTE_{Molding} \cdot E_{Molding} \cdot THK_{Molding}}{CTE_{Compensation} \cdot E_{Compensation}},$$

wherein $CTE_{Molding}$ is the coefficient of thermal expansion of the molding compound, $E_{Molding}$ is the Young's Modulus of the molding compound, $THK_{Molding}$ is a thickness of the molding compound $CTE_{Compensation}$ is the coefficient of thermal expansion of the stress compensation layer and $E_{Compensation}$ is the Young's Modulus of the stress compensation layer; and a second substrate electrically coupled to the first substrate on the first side.

2. The semiconductor device of claim 1, further comprising a second die electrically coupled to the first side of the first substrate.

3. The semiconductor device of claim 1, further comprising a die package positioned over the first die and electrically coupled to the first substrate, the die package comprising the second substrate and a second die.

4. The semiconductor device of claim 1, wherein the stress compensation layer comprises a molding compound.

5. The semiconductor device of claim 1, wherein the stress compensation layer is formed of an additional molding compound.

6. The semiconductor device of claim 1 further comprising a solder region extending into the through-opening in the stress compensation layer.

7. A semiconductor device comprising:
a first package, the first package comprising a first integrated circuit die;
a first substrate, the first substrate having a first set of conductive features on a first side and a second set of conductive features on a second side, the first package being coupled to a first subset of the first set of conductive features on the first side of the first substrate;
a second integrated circuit die electrically coupled to a second subset of the first set of conductive features on the first side of the first substrate;
a molding compound at least partially encapsulating the second integrated circuit die, the molding compound exerts a first stress to the first substrate; and
a stress compensation layer formed of an additional molding compound along the second side of the first substrate, the stress compensation layer having openings formed therein to at least partially expose corresponding ones of the second set of conductive features on the second side of the first substrate, the stress compensation layer exerting a second stress on the first substrate, with the second stress compensates for, and being substantially equal to, the first stress, wherein the molding compound and the stress compensation layer are limited to the first side and a second side, respectively, of the first substrate, and wherein a thickness of the stress compensation layer is about:

$$\frac{CTE_{Molding} \cdot E_{Molding} \cdot THK_{Molding}}{CTE_{Compensation} \cdot E_{Compensation}},$$

wherein $CTE_{Molding}$ is the coefficient of thermal expansion of the molding compound, $E_{Molding}$ is the Young's Modulus of the molding compound, $THK_{Molding}$ is a thickness of the molding compound, $CTE_{Compensation}$ is the coefficient of thermal expansion of the stress compensation layer, and $E_{Compensation}$ is the Young's Modulus of the stress compensation layer; and solder regions extending into the openings.

8. The semiconductor device of claim 7, wherein an upper surface of the second integrated circuit die is exposed.

9. The semiconductor device of claim 7, wherein the first substrate comprises a silicon interposer.

10. The semiconductor device of claim 7, wherein an air gap exists between the second integrated circuit die and the first package.

11. The semiconductor device of claim 7, wherein the stress compensation layer comprises a liquid molding compound layer.

12. The semiconductor device of claim 7, wherein the stress compensation layer comprises a polyimide.

13. The semiconductor device of claim 7, wherein a surface of the stress compensation layer is substantially coplanar with surfaces of the solder regions.

14. A method of forming a semiconductor device, the method comprising:
  providing a first substrate having a first side and an opposing second side, the first substrate having conductive features on the second side;
  attaching a first die to the first side of the first substrate;
  forming a molding compound adjoining, and limited to, the first side of the first substrate;
  determining a desired thickness of a stress compensation layer as about $$\frac{CTE_{Molding} \cdot E_{Molding} \cdot THK_{Molding}}{CTE_{Compensation} \cdot E_{Compensation}},$$

wherein $CTE_{Molding}$ is the coefficient of thermal expansion of the molding compound, $E_{Molding}$ is the Young's Modulus of the molding $THK_{Molding}$ is a thickness of the molding compound, $CTE_{Compensation}$ is the coefficient of thermal expansion of the stress compensation layer, and $E_{Compensation}$ is the Young's Modulus of the stress compensation layer; and forming the stress compensation layer having the desired thickness adjoining, and limited to, the second side of the first substrate, the stress compensation layer having openings exposing the conductive features, wherein the stress compensation layer counters a stress applied to the first substrate by the molding compound, with a first stress exerted to the first substrate by the stress compensation layer being substantially equal to a second stress exerted to the first substrate by the molding compound.

15. The method of claim 14, further comprising determining a desired thickness of the stress compensation layer, the determining being based at least in part on a coefficient of thermal expansion of the stress compensation layer.

16. The method of claim 14, further comprising coupling a die package to the first side of the first substrate, the die package comprising a second die.

17. The method of claim 16, wherein the die package covers the first die.

18. The method of claim 14, wherein the first substrate comprises a silicon interposer.

19. The method of claim 14, wherein the stress compensation layer comprises a molding compound.

20. The method of claim 14 further comprising disposing solder regions into the openings.

* * * * *